United States Patent
Xu

(10) Patent No.: US 7,375,955 B2
(45) Date of Patent: May 20, 2008

(54) COMPUTER BEZEL

(75) Inventor: Ji-Guo Xu, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 349 days.

(21) Appl. No.: 11/142,503

(22) Filed: Jun. 1, 2005

(65) Prior Publication Data

US 2005/0276022 A1  Dec. 15, 2005

(30) Foreign Application Priority Data

Jun. 12, 2004  (CN)  .................. 2004 2 0047135 U

(51) Int. Cl.
*G06F 1/16* (2006.01)
*H05K 5/00* (2006.01)
*H05K 7/00* (2006.01)

(52) U.S. Cl. ........................ 361/683; 361/752; 361/756

(58) Field of Classification Search ................ 361/752, 361/790, 797, 800, 756, 727, 741, 686
See application file for complete search history.

(56) References Cited

U.S. PATENT DOCUMENTS

| | | | | |
|---|---|---|---|---|
| 5,169,218 A * | 12/1992 | Chu | ........................ | 312/223.2 |
| 5,820,235 A * | 10/1998 | Tsai | ........................ | 312/223.2 |
| 5,924,780 A * | 7/1999 | Ammon et al. | .......... | 312/223.2 |
| 6,049,452 A * | 4/2000 | You et al. | .................... | 361/685 |
| 6,132,019 A * | 10/2000 | Kim et al. | ................ | 312/223.2 |
| 6,398,327 B1 * | 6/2002 | Momoze | .................. | 312/319.1 |
| 6,415,622 B2 * | 7/2002 | Kim et al. | ..................... | 62/409 |
| 7,254,821 B2 * | 8/2007 | Chen et al. | ................. | 720/655 |
| 2004/0104648 A1 * | 6/2004 | Chiang | ........................ | 312/323 |
| 2007/0019389 A1 * | 1/2007 | Du | .............................. | 361/728 |

FOREIGN PATENT DOCUMENTS

CN  02271444.8  6/2003
TW  577567  2/2004

* cited by examiner

*Primary Examiner*—Tuan T. Dinh
*Assistant Examiner*—Hung S Bui
(74) *Attorney, Agent, or Firm*—Morris Manning Martin LLP; Tim Tingkang Xia, Esq.

(57) ABSTRACT

A computer bezel includes a main body (100), a shutter (10) movably attached to the main body, a pair of springs (50) connecting the shutter and the main body, and a bracket (40). The main body includes an opening (110) and a pair of flanges (103). A first rail (120) and a second rail (130) are defined in each flange. The first rail and the second rail each include an orientating rail (124, 134) and a guiding rail (122, 132). A door lock (170) is secured on the main body. The shutter includes a first sliding portion (22), a second sliding portion (24), and an engaging end (36). When the first sliding portion and the second sliding portion slide into the guiding rail, the shutter is opened, the engaging end is engaged into the door lock, and the springs are extended. When the first sliding portion and the second sliding portion slide into the orientating rail, the shutter is closed, the engaging end is disengaged from the door lock, and the springs are rebounded.

19 Claims, 5 Drawing Sheets

COMPUTER BEZEL

CROSS-REFERENCE TO RELATED APPLICATIONS

This application is related to a U.S. patent application entitled "ELECTRONIC APPLIANCE AND ENCLOSURE THEREOF", filed on Oct. 29, 2004 with application Ser. No. 10/977,812, and with the same assignee as the instant application. The disclosure of the above identified application is incorporated herein by reference.

BACKGROUND OF THE INVENTION

1. Field of the Invention

The present invention relates to computer bezels, and particularly to a computer bezel with a shutter which is slidably attached to the computer bezel and convenient to be opened and closed.

2. General Background

A computer often includes some drivers such as, for example, floppy disc driver, optical disc driver, hard disc driver. These drivers are mounted in the computer chassis. The computer bezel has corresponding openings for loading in/out the floppy discs, optical discs and hard discs. For protecting the computer, some shutters are often mounted on the computer bezel to cover the openings.

Some typically computer bezel with such shutters are found. In such examples, shutters are pivotly attached to the computer bezel. When in using, the shutter is secundly opened. In such an arrangement, the shutter extends towards the outside of the computer bezel after being opened, and then the shutter is easily to be damaged by accident.

What is needed, therefore, is a computer bezel with a shutter which covers the opening exactly, and is convenient to be opened and closed.

What is also needed, is a computer bezel with a shutter which is securely attached to the computer bezel after being opened.

SUMMARY

In a preferred embodiment, a computer bezel includes a main body, a shutter movably attached to the main body, a pair of springs connecting the shutter and the main body, and a bracket. The main body includes an opening and a flange extending from the main body at each opposite side of the opening. A first rail and a second rail are defined in the flange. The first rail and the second rail include an orientating rail and a guiding rail. A door lock is secured on the main body. The shutter includes a first sliding portion, a second sliding portion, and an engaging end extending from a bottom of the shutter. When the first sliding portion and the second sliding portion slide into the guiding rail, the shutter is accommodated in to the inner side of the main body and the opening is uncovered. At the same time, the engaging end is engaged into the door lock, and the springs are extended. When the engaging end is disengaged from the door lock, the springs are rebounded. Then the first sliding portion and the second sliding portion slide into the orientating rail, the shutter slide into the opening and covers the opening exactly.

Other objects, advantages and novel features of the present invention will become more apparent from the following detailed description of preferred embodiments when taken in conjunction with the accompanying drawings, in which:

DETAILED DESCRIPTION OF THE PREFERRED EMBODIMENT

Figure 1:
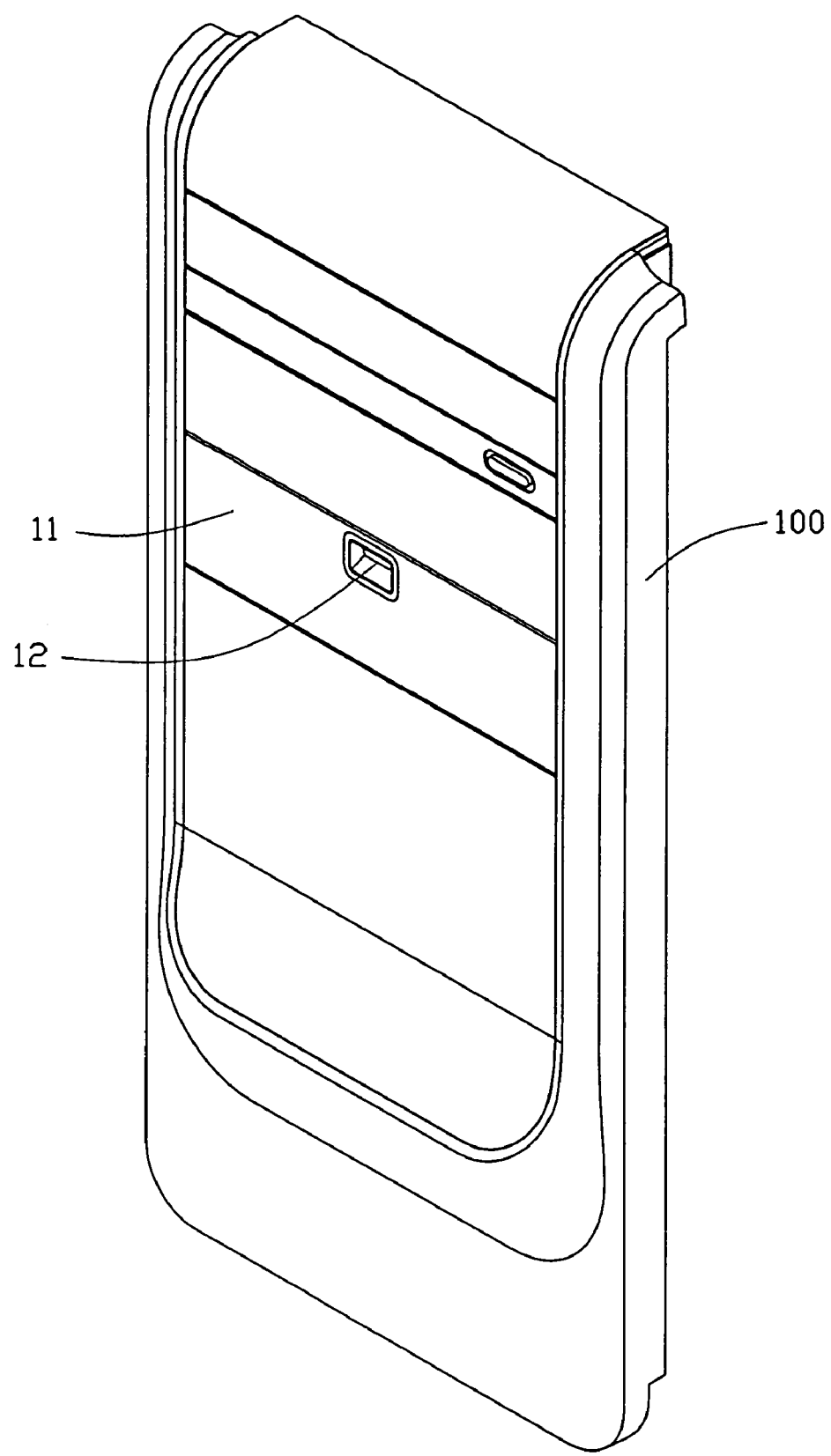
FIG. 1 is an isometric view of a computer bezel in accordance with a preferred embodiment of the present invention.
Figure 2:
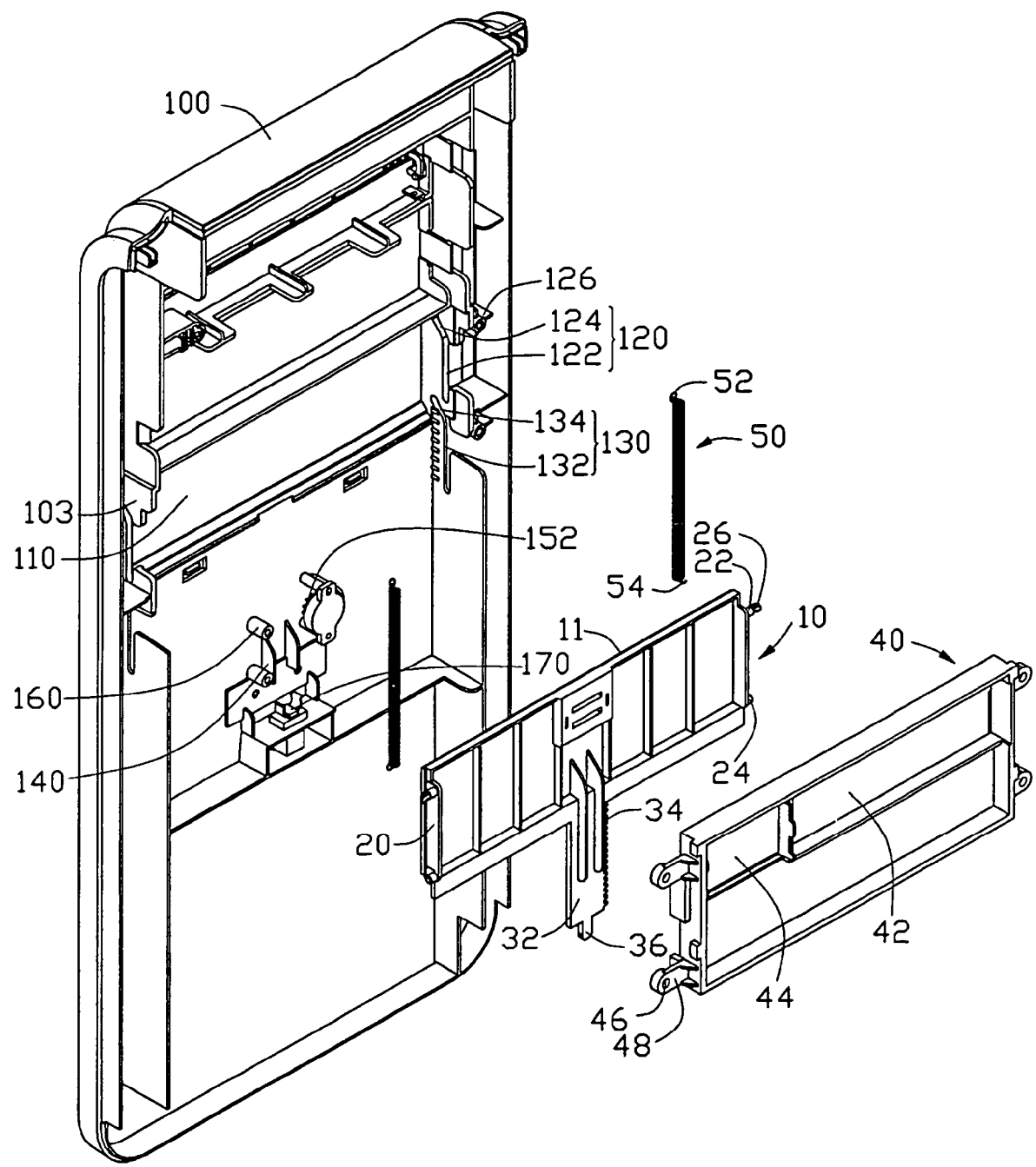
FIG. 2 is an exploded, isometric view of the computer bezel of FIG. 1 from another aspect.

Refer to FIG. 1 and FIG. 2, a bezel of an electronic device like a computer in accordance with a preferred embodiment of the present invention includes a main body 100, a shutter 10 which is movably attached to the main body 100, a pair of resilient components such as springs 50, and a bracket 40. A speed control mechanism is also formed in the bezel.

The main body 100 is often rectangular, and mounted on a front surface of a computer chassis (not shown). An opening 110 is defined in the main body 100 for mounting internal devices of the computer, for example, read/write devices such as storage drivers (not shown) and I/O interface components (not shown). A flange 103 extends inwardly from each side of the opening 110. A first rail 120 and a second rail 130 are aligned uprightly in each flange 103. Each first rail 120 includes a guiding rail 122 parallel with the main body 100, and an orientating rail 124 extending from one end of the guiding rail 122 and slanting towards the main body. Each second rail 130 also includes a guiding rail 132 and an orientating rail 134 extending from one end of the guiding rail 132 and slanting towards the main body 100. A pair of posts 126 with screw holes (not labeled) is formed on the main body 100 nearby each side of the flange 103. A gear 152, as a part of the speed control mechanism, is secured on the main body 100 under the opening 110. A pair of posts 160 is aligned uprightly at the main body 100 at one side of the gear 152. A pair of guiding tabs 140 is formed at the main body 100 between the gear 152 and the posts 160. A locking device such as, for example, a door lock 170 is secured on the main body 100 under the guiding tabs 140. A post (not shown) with screw holes is formed on the main body 100 over an outside of each flange 103.

The shutter 10 includes a cover 11 whose size is fit for the opening 110. A side plate 20 extends inwardly from each side of the cover 11. A first sliding portion 22 corresponding to the first rail 120 and a second sliding portion 24 corresponding to the second rail 130 are formed on each side plate 20. A hook 26 is formed on each first sliding portion 22. A sliding bar 32 extends from a middle portion of a bottom of the cover 11. A rack 34, as the other part of the speed control mechanism, is formed along one side edge of the sliding bar 32 corresponding to the gear 152 of the main body 100. A barbed engaging end 36 extends from a bottom of the sliding bar 32 corresponding to the door lock 170 of the main body 100. The front surface of the shutter 10 has an operating member 12 such as, for example, a recess.

The bracket 40 for baffling the shutter 10 to be pushed away from the main body 100 is often rectangular corresponding to the opening 110 of the main body 100. The bracket 40 has a bigger opening 42 for floppy discs and a smaller I/O interface opening 44. A fastening piece 48 with a fastening hole 46 protrudes outwardly from each side of the bracket 40 corresponding to each post 126 of the main body 100.

Each spring 50 includes clasps 52, 54 extending from distal ends thereof, respectively.

Figure 3:
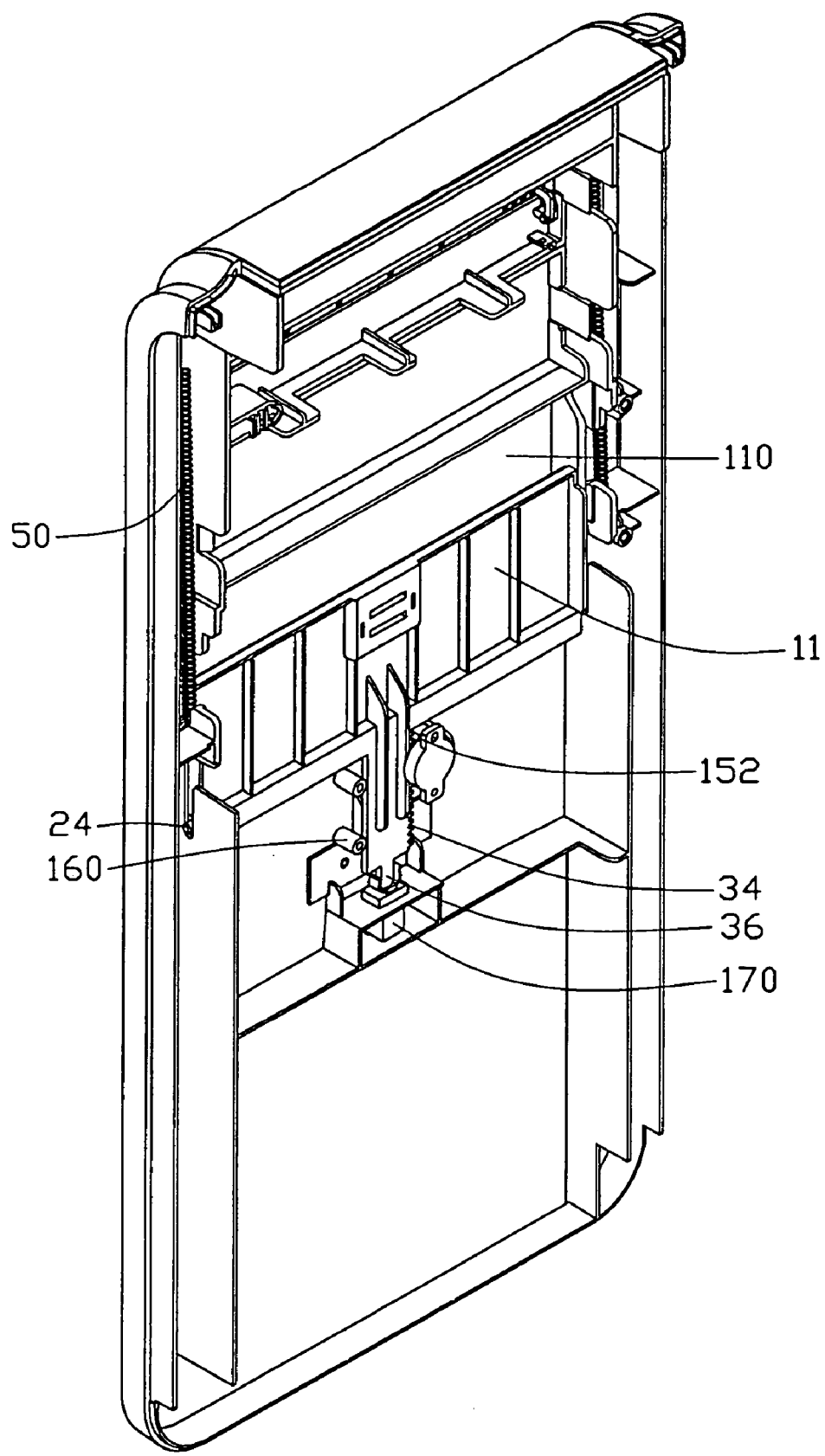
FIG. 3 is a partly assembled view of FIG. 2, showing the shutter of the computer bezel in an open state.
Figure 4:
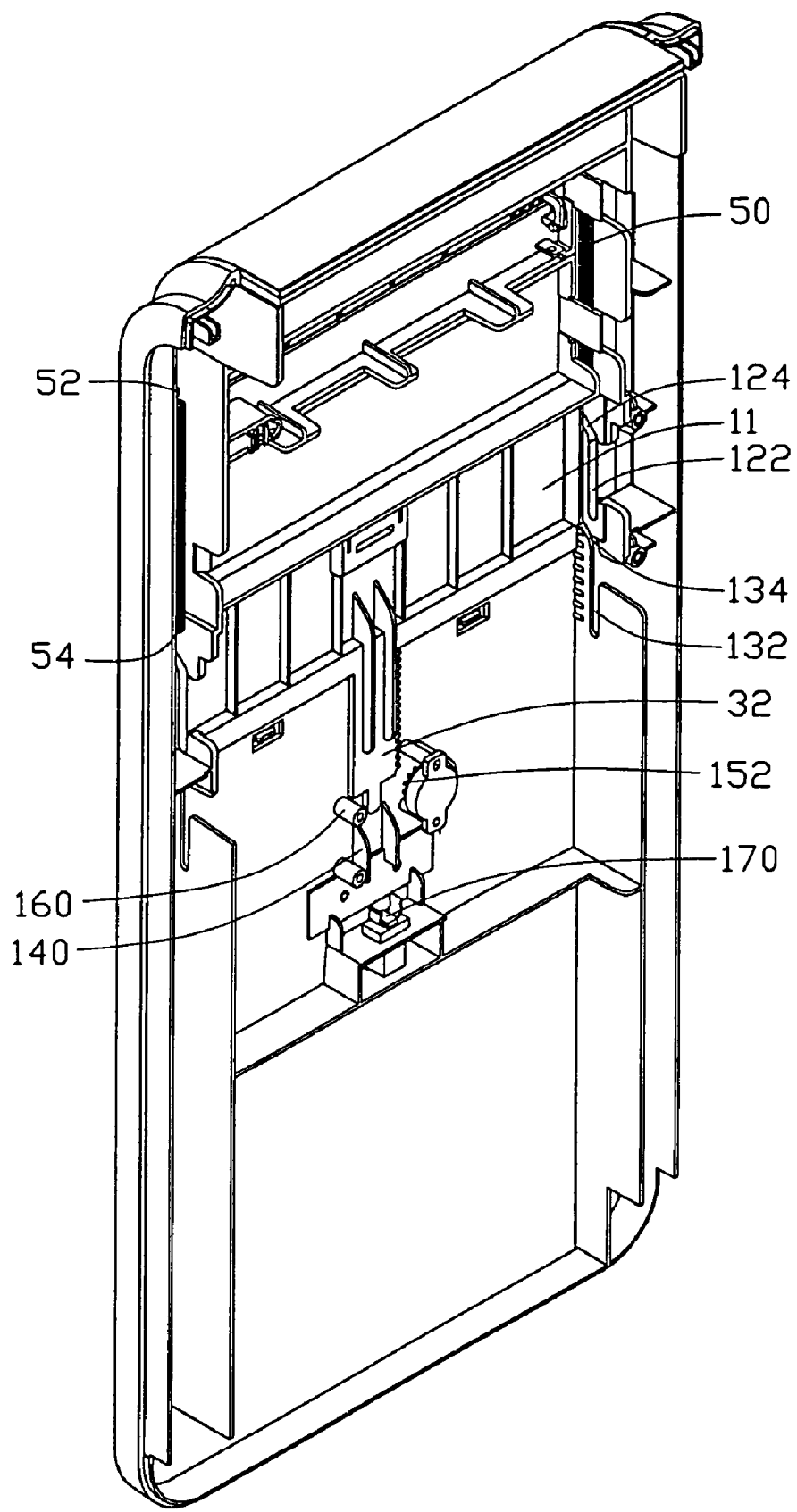
FIG. 4 is similar to FIG. 3, but showing the shutter in a closed state.
Figure 5:
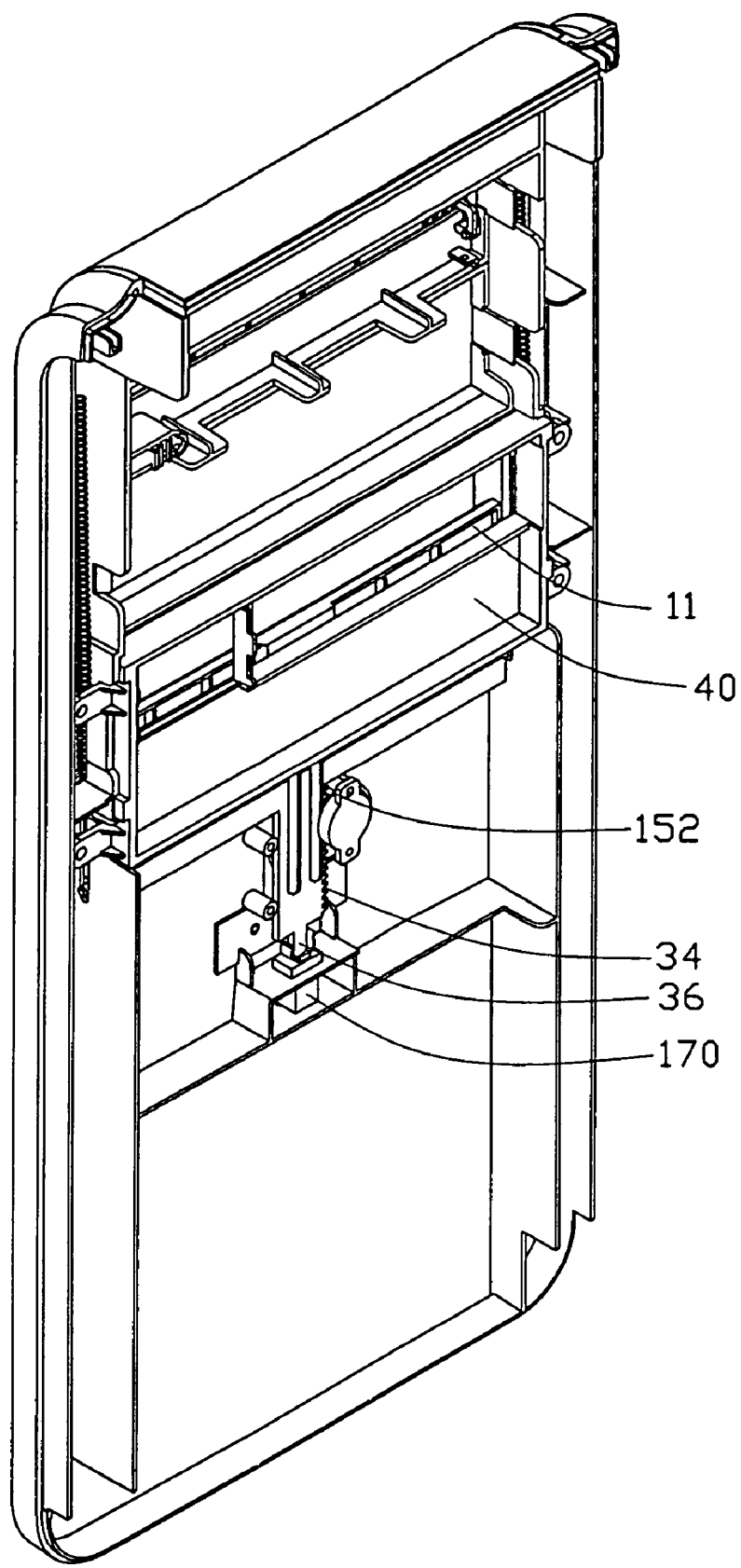
FIG. 5 is an assembled view of FIG. 2.

Refer to FIGS. 3-5, in assembly, firstly, the clasp 52 of each spring 50 is mounted to the post of the main body 100 via screw. The clasp 54 of each spring 50 is engaged with the corresponding hook 26 of the shutter 10. Then the shutter 10 is mounted to the main body 100. The first sliding portion 22 is positioned in the guiding rail 122 of the first rail 120 of the main body 100. The second sliding portion 24 is positioned in the guiding rail 132 of the second rail 130 of the main body 100. The sliding bar 32 of the shutter 10 is positioned between the gear 152 and the posts 160 of the main body 100. At the time, the rack 34 of the sliding bar 32 is meshed with the gear 152. Finally, a screw (not shown) is passed through a corresponding fastening hole 46 of the bracket 40 and engages in a corresponding screw hole of the post 126 of the main body 100. Thus the bracket 40 is secured to the inside of the main body 100 and restricts the shutter 10.

When the first sliding portion 22 and the second sliding portion 24 of the shutter 10 are at bottom ends of the guiding rails 122, 124 which are away from the orientating rails 124, 134, the shutter is opened. Thus the opening 110 of the main body 100, the bigger opening 42 and the smaller I/O interface opening 44 of the bracket 40 are available. At the time, the sliding bar 32 of the shutter 10 is on the top of the guiding tabs 140 so that the shutter is spaced with the main body 100 and accommodated in to the inner side of the main body 100. The engaging end 36 of the shutter 10 is engaged into the door lock 170 of the main body 100, and the springs 50 are extended, as shown in FIG. 3.

When the shutter is pressed downwardly via pressing the recess 12, the engaging end 36 of the shutter 10 is ejected from the door lock 170. Then the first sliding portion 22 and the second sliding portion 24 slide upwardly along the first guiding rail 122 and the second guiding rail 132 respectively due to the resilience of the springs 50. At the time, the rack 34 and the gear 152 are operative together. Since the first sliding portion 22 and the second sliding portion 24 slide into the orientating rails 124, 134, the shutter 10 slides into the opening 110 of the main body 100 along the slope of the guiding tabs 140 so that the shutter 10 is in the same plane with the front surface of the main body 100. Thus it is possible to achieve appropriate dustproof effect, as shown in FIGS. 1 and 5.

In opening the shutter 10, the shutter 10 is pressed via pressing the recess 12, then the first sliding portion 22 and the second sliding portion 24 slide into the first guiding rail 122 and the second guiding rail 132 respectively, and the sliding bar 32 slides onto the top of the guiding tabs 140. At the time, the rack 34 and the gear 52 are operative together until the engaging end 36 is engaged into the door lock 170. Thus the shutter 10 is opened and the opening 110 of the main body 100 is uncovered.

During the opening and closing process of the shutter 10, the associated operation of the rack 34 and the gear 52 provide mitigation for the movement of the shutter 10.

Furthermore, it is possible that the first rail 120 and the second rail 130 include only orientating rails which extend slantways.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

I claim:

1. A computer bezel comprising:
    a main body comprising an opening, a flange extending rearward from the main body at each of opposite sides of the opening, a rail defined in the flange, a locking member arranged at a rear side of the main body;
    a shutter slidably attached to the rear side of the main body, a sliding portion extending from the shutter to slide in the rail, an engaging end formed at the shutter to engage with the locking member, an operating member formed at a front surface of the shutter;
    a bracket secured to the rear side of the main body to sandwich the shutter together with the main body for baffling the shutter to be pushed away from the main body; and
    a resilient member connecting the shutter and the main body;
    wherein the operating member is operated to slide down the shutter to be retained between the main body and the bracket and against the resilient member for exposing the opening until the engaging end of the shutter engages with the locking member, the operating member is operated to disengage the engaging end of the shutter from the locking member of the main body, the resilient member rebounds to pull up the shutter for covering the opening.

2. The computer bezel as claimed in claim 1, wherein the rail comprises an orientating rail slanting towards the rear side of main body.

3. The computer bezel as claimed in claim 2, wherein the rail further comprises a guiding rail extending from one end of the orientating rail and parallel with the main body.

4. The computer bezel as claimed in claim 1, wherein a sliding bar extends from a bottom of the shutter, and the engaging end extends from a bottom of the sliding bar.

5. The computer bezel as claimed in claim 4, wherein a rack is formed along one side of the sliding bar, and a gear is arranged at the main body corresponding to the rack.

6. The computer bezel as claimed in claim 1, wherein the resilient member comprises a pair of springs respectively connecting opposite ends of the shutter to the main body.

7. The computer bezel as claimed in claim 1, wherein the operating member comprises a recess defined in the shutter.

8. A computer bezel comprising:
    a main body, an opening defined in the main body, a pair of flanges extending from the main body beside the opening, a guiding rail extending from each of the flanges and parallel with the main body, a slanted rail extending from one end of each guiding rail and slanting towards the main body, a locking member arranged at the main body below the opening;
    a shutter forming a sliding portion sliding in the slanted rail and the guiding rail so that the shutter is slidable inside the main body for exposing or covering the opening of the main body in two using states respectively, an engaging end formed at the shutter to engage with the locking member; and
    a resilient member connecting the shutter and the main body, the resilient member rebounding to slide up the shutter inside the main body.

9. The computer bezel as claimed in claim 8, further comprising a bracket secured to the main body for baffling the shutter to be pushed away from the main body.

10. The computer bezel as claimed in claim 8, wherein a sliding bar extends from a bottom of the shutter, and the engaging end extends from a bottom of the sliding bar.

11. The computer bezel as claimed in claim 10, wherein a guiding portion is arranged at the main body corresponding to the sliding bar.

12. The computer bezel as claimed in claim 8, wherein the resilient member comprises a pair of springs respectively connecting opposite ends of the shutter to the main body.

13. The computer bezel as claimed in claim 8, wherein an operating member is formed in a front surface of the shutter, the operating member comprises a recess.

14. The computer bezel as claimed in claim 8, wherein the locking member catches the engaging end of the shutter when the engaging end is pushed into the locking member; the locking member releases the engaging end of the shutter when the engaging end is further pushed.

15. An electronic device comprising:
   a bezel partially enclosing said electronic device, said bezel having an opening;
   an internal device disposed in said electronic device and next to said opening so as to be exposable from said opening;
   a shutter disposed beside said bezel and resiliently movable without rotation between a first position where said shutter covers said opening to shield said internal device from an outside of said electronic device, and a second position where said shutter moves away from said opening to expose said internal device to said outside of said electronic device;
   a bracket secured to the bezel to sandwich said shutter together with said bezel for baffling the shutter to be pushed away from said bezel; and
   a speed control mechanism disposed between said bezel and said shutter so as to control speed of resilient movement of said shutter between said first and second positions thereof.

16. The electronic device as claimed in claim 15, wherein said speed control mechanism comprises a rack formed on said shutter, and a gear secured in said bezel and engagable with said rack.

17. The electronic device as claimed in claim 15, wherein a locking member is formed on the bezel below the opening, an engaging end extends downward from a bottom of the shutter to engage with the locking member.

18. The electronic device as claimed in claim 15, wherein a resilient member connects the shutter and the bezel, the resilient member rebounds to slide up the shutter between the bezel and the shutter.

19. The electronic device as claimed in claim 15, wherein a pair of first sliding portions extend from opposite sides of the shutter respectively, a pair of second sliding portions extend from the opposite sides of the shutter below the first sliding portions respectively, a pair of upper rails and a pair of lower rails are defined in two flanges of the bezel at two opposite sides of the opening, the first sliding portions and the second sliding portions slide upward or downward along the upper and lower rails respectively so that the shutter is moved upward or downward without rotation.

* * * * *